(12) United States Patent
Yasuda et al.

(10) Patent No.: US 7,583,086 B2
(45) Date of Patent: Sep. 1, 2009

(54) POTENTIAL SENSOR

(75) Inventors: Susumu Yasuda, Machida (JP);
Takayuki Yagi, Yokohama (JP); Takashi Ushijima, Yokohama (JP); Yoshitaka Zaitsu, Kawasaki (JP); Yoshikatsu Ichimura, Setagaya-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/822,320

(22) Filed: Jul. 5, 2007

(65) Prior Publication Data
US 2007/0257682 A1 Nov. 8, 2007

Related U.S. Application Data

(62) Division of application No. 10/551,112, filed as application No. PCT/JP2004/004342 on Mar. 26, 2004, now Pat. No. 7,274,193.

(30) Foreign Application Priority Data
Mar. 28, 2003 (JP) .............................. 2003-089465

(51) Int. Cl.
*G01R 29/12* (2006.01)
(52) U.S. Cl. ...................... 324/458; 324/457
(58) Field of Classification Search ................ 324/458, 324/457, 658, 678, 661, 686, 72, 72.5, 76.66, 324/76.11, 447, 713
See application file for complete search history.

(56) References Cited

U.S. PATENT DOCUMENTS

| | | | | |
|---|---|---|---|---|
| 4,055,798 A * | 10/1977 | Kato | .......................... | 324/458 |
| 5,517,123 A * | 5/1996 | Zhao et al. | .................. | 324/458 |
| 5,657,006 A * | 8/1997 | Kinoshita et al. | ...... | 340/870.37 |
| 5,767,686 A * | 6/1998 | Kespohl | ..................... | 324/662 |
| 6,177,800 B1 * | 1/2001 | Kubby et al. | ................ | 324/458 |
| 6,657,434 B2 * | 12/2003 | Urano et al. | ................ | 324/458 |
| 6,806,717 B2 | 10/2004 | Werner et al. | .............. | 324/458 |
| 6,965,239 B2 | 11/2005 | Yasuda et al. | .............. | 324/458 |
| 7,242,882 B2 * | 7/2007 | Ichimura et al. | ............. | 399/48 |
| 2003/0057977 A1 | 3/2003 | Werner, Jr. et al. | ......... | 324/754 |

(Continued)

FOREIGN PATENT DOCUMENTS

DE 2715831 10/1978

(Continued)

OTHER PUBLICATIONS

Riehl, P.S., "Microsystems for Electrostatic Sensing", Dissertation, Nov. 2002, pp. 1-8, 32-40, 79-84.

(Continued)

*Primary Examiner*—Hoai-An D Nguyen
(74) *Attorney, Agent, or Firm*—Fitzpatrick, Cella, Harper & Scinto (57) ABSTRACT

A potential sensor including first and second detection electrodes opposed to an object of which a potential is to be measured, and a movable shutter so positioned between the detection electrodes and the potential-measured object with gaps thereto. The movable shutter can assume a first state and a second state. The first detection electrode is exposed to the potential-measured object wider when the movable shutter assumes the second state. The second detection electrode is exposed to the potential-measured object narrower when the movable shutter assumes the first state than when the movable shutter assumes the second state.

5 Claims, 8 Drawing Sheets

U.S. PATENT DOCUMENTS

2006/0171728 A1 8/2006 Ichimura et al. .............. 399/48
2006/0186898 A1 8/2006 Ichimura et al. ............ 324/663

FOREIGN PATENT DOCUMENTS

DE        10044887        5/2001
EP        1 003 044 A2    5/2000

OTHER PUBLICATIONS

Hsu, C.H. et al., "Micromechanical Electrostatic Voltmeter", Proc. Int'l. Conf. on Solid State Sensors and Actuators, NY, IEEE, US, vol. Conf. 6, Jun. 24, 1991, pp. 659-662.

* cited by examiner

(PRIOR ART)

FIG. 9

(PRIOR ART)

FIG. 10

(PRIOR ART)

FIG. 11

POTENTIAL SENSOR

This application is a divisional of application Ser. No. 10/551,112, which was the National Stage of International Application No. PCT/JP2004/004342, filed Mar. 26, 2004, the contents both of which are incorporated by reference herein.

TECHNICAL FIELD

The present invention relates to a potential sensor of non-contact type which can be easily prepared by a MEMS (micro electro mechanical systems) technology, and an image forming apparatus and a potential measuring method utilizing such potential sensor.

BACKGROUND ART

Figure 9:
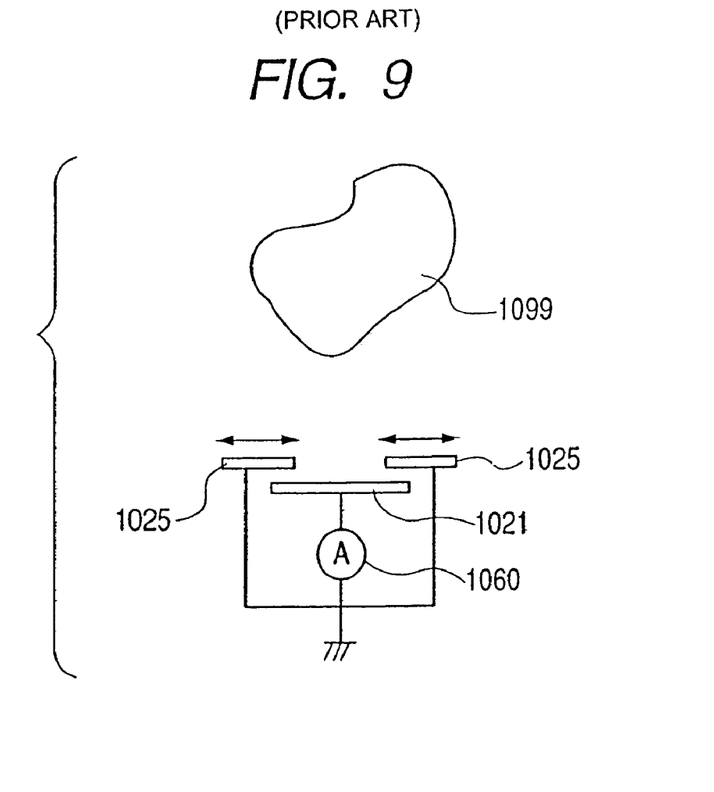
FIG. 9 is a view showing a general operation principle of a prior potential sensor of mechanical type.

As a sensor for measuring a surface potential of a measured object, there is already known a variable capacitance potential sensor of mechanical type. FIG. 9 shows a principle of the variable capacitance potential sensor of mechanical type. A measured object 1099 has a potential V relative to a ground potential. A detection electrode 1021 is provided in an opposed relationship thereto, and a movable shutter 1025 is provided immediately above the detection electrode 1021. When the movable shutter 1025 moves, an electrostatic capacitance C between the measured object 1099 and the detection electrode 1025 shows a variation. In the detection electrode 1021, a charge Q is induced according to V and C. A current flowing between the detection electrode 1021 and the ground is detected by an ammeter 1060. As the charge Q induced in the detection electrode 1021 is given by Q=CV, a current flowing in the ammeter 1060 at a time t is given by i=dQ/dt=VdC/dt, and the potential V can be obtained if dC/dt is known. The dC/dt is a sensitivity of this sensor, and, as will be apparent from this relation, the sensitivity can be elevated by increasing the difference between the maximum and minimum values of C or reducing the time t of variation.

Figure 10:
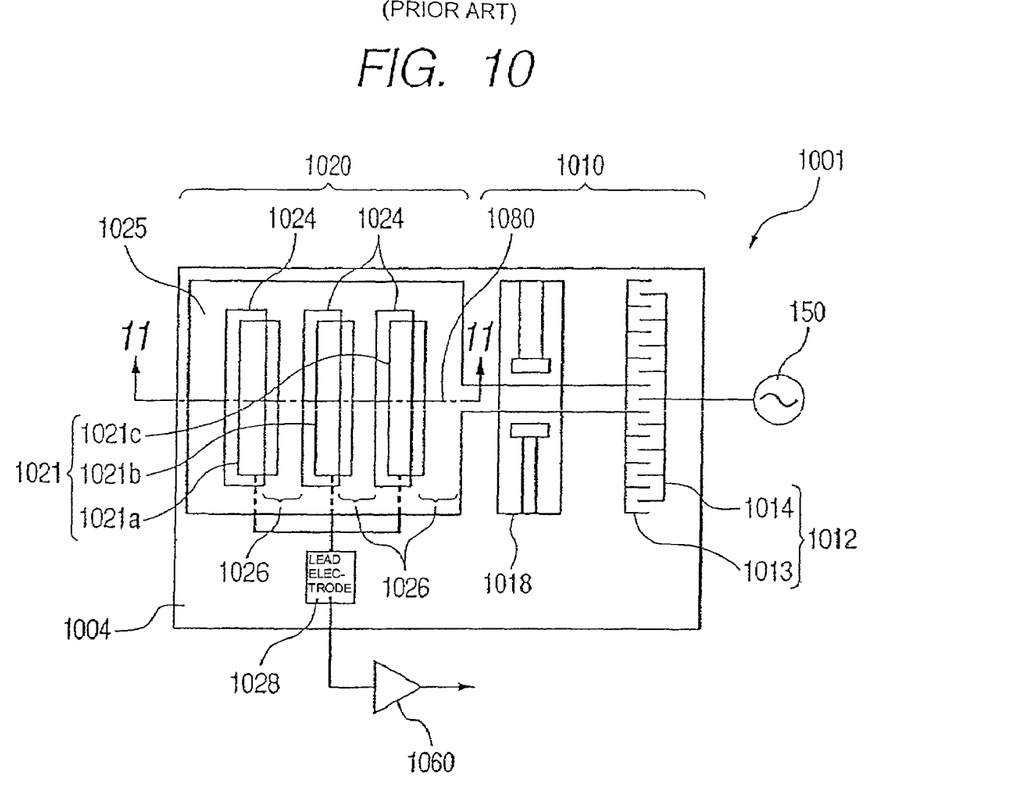
FIG. 10 is a view showing a prior MEMS potential sensor.

Such variable capacitance potential sensor of mechanical type, obtainable with the MEMS technology, is for example known in a following type (cf. U.S. Pat. No. 6,177,800). FIG. 10 illustrates a potential sensor 1001, which is constituted by a driver component 1010 and a sensor component 1020. These components can be prepared by the MEMS technology on a substrate 1004.

The driver component 1010 is formed by a suspension 1018 having a parallel hinge structure, and a comb-shaped electrostatic actuator 1012. The comb-shaped electrostatic actuator 1012 is a common mechanism for electrostatically driving a micro structure, and is constituted by a movable electrode 1013 supported by the suspension 1018 and a fixed electrode 1014 mounted on the substrate 1004. The comb-shaped electrostatic actuator 1012 is electrically connected to an electrostatic drive signal source 10501. The movable electrode 1013 is supported by the suspension 1018 so as to be movable in a lateral direction in the drawing. The comb-shaped electrodes of the movable electrode 1013 and those of the fixed electrode 1014 are mutually meshing and an electrostatic attractive force is exerted therebetween when a potential difference is given.

The driver component 1010 is connected to the sensor component 1020. A detection electrode assembly 1021 is fixed to the substrate 1004 and is capable of a capacitative coupling with a measured surface. The detection electrode assembly 1021 is constituted by a set of mutually separated individual detection electrodes (represented by 1021a, 1021b, 1021c). Individual detection probes are connected together, so that the individual signals are combined (superposed). The sensor component 1020 is further provided with a movable shutter 1025, which selectively covers the detection electrode assembly 1021. The movable shutter 1025 is mechanically connected to the driver component 1010, of which a linear displacement induces a corresponding displacement of the movable shutter 1025.

The movable shutter 1025 is provided with plural apertures 1024, which are so constructed as to selectively expose the detection electrode assembly 1021 through the apertures 1024 when the movable shutter 1025 is in a first position. The apertures 1024 are mutually separated by a distance corresponding to a distance between the detection electrodes. When the movable shutter 1025 is in a second position, the detection electrode assembly 1021 is covered by mask portions 1026 present between the apertures 1024. Stated differently, when the movable shutter 1025 is in the first position, the capacitative coupling by the detection electrode assembly 1021 is enabled. On the other hand, when the movable shutter 1025 is in the second position, the detection electrode assembly 1021 is masked and prevented from the capacitative coupling. A current generated in the detection electrode assembly is outputted to a lead electrode 1028 and is amplified by an amplifier 1060.

Figure 11:
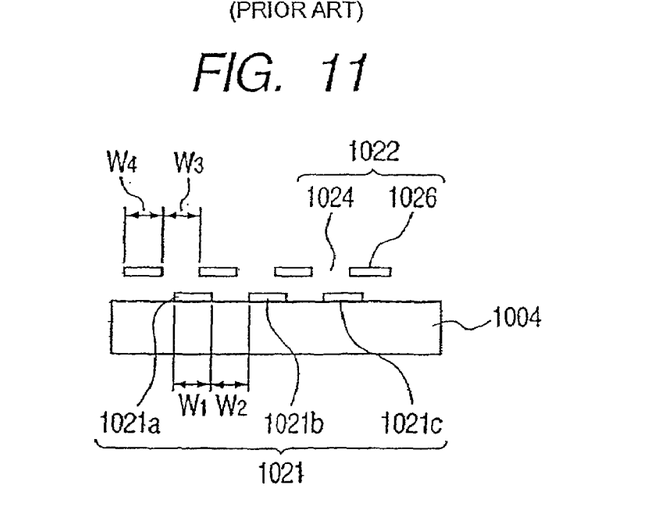
FIG. 11 is a view showing drawbacks in the prior MEMS potential sensor.

However, in the MEMS potential sensor of the aforementioned structure, the detection sensitivity cannot be made sufficiently high because an effective area of the detection electrode cannot be made large as will be explained in the following with reference to FIG. 11. The detection sensitivity dC/dt of the potential sensor is proportional to the effective area of the detection electrode. FIG. 11 is a cross-sectional view along a line 11-11 in FIG. 10. Let it be assumed that a detection electrode 1021 has a width W1, an interval between the detection electrodes is a length W2, an aperture 1024 has a width W3, and a mask portion 1026 has a width W4. In order that the detection electrode can be exposed completely, width W3 of the aperture has to be equal to or larger than width W1 of the electrode (W3≧W1). In order that the detection electrode can be masked completely, first, width W4 of the mask portion has to be equal to or larger than width W1 of the electrode (W4≧W1). In addition, the interval W2 has to be equal to or larger than width W3 of the aperture. On the other hand, a condition of the widths for efficiently exposing and masking the detection electrode with a minimum moving distance of the movable shutter is given by setting up the widths and interval equal to one another. Consequently, widths W1 and W2 are almost equal to each other so that the effective area of the detection electrodes has been limited to about a half of an occupied area on the substrate.

The present invention has been made in consideration of the aforementioned situation.

DISCLOSURE OF THE INVENTION

According to an aspect of the present invention, there is provided that a potential sensor comprising first and second detection electrodes opposed to a potential-measured object of which a potential is to be measured, and a movable shutter so positioned between the detection electrodes and the potential-measured object with gaps thereto; wherein the movable shutter can assume a first state and a second state, the first detection electrode is exposed to the potential-measured object wider when the movable shutter assumes the first state than when the movable shutter assumes the second state, and the second detection electrode is exposed to the potential-measured object narrower when the movable shutter assumes the first state than when the movable shutter assumes the second state. Such configuration allows to increase the effective area of the detection electrodes since the first and second detection electrodes can be positioned closer, and to increase the sensitivity for a given size, as a signal is obtained by a differential processing of outputs of the electrodes. Also it can be realized in a smaller size for a same sensitivity, thus allowing a compact structure and a cost reduction.

The potential sensor preferably comprises a substrate, first and second detection electrode assemblies of which at least either one is formed in plural parts and which are provided on the substrate, and at least one movable shutter on the two sets of the detection electrode assemblies with a gap thereto, wherein the first detection electrode assembly is exposed to a potential-measured object wider when the movable shutter assumes a first state than when the movable shutter assumes a second state, and the second detection electrode assembly is exposed to the potential-measured object narrower when the movable shutter assumes the first state than when the movable shutter assumes the second state. Though each of the first and second detection electrodes may be formed by a single part, the structure of such configuration allows to further increase the effective area of each detection electrode.

In the potential sensor, the movable shutter is preferably elastically supported movably between the first state and the second state. Thereby there can be realized a movement of the movable shutter not hindered by a friction. A drive frequency of the potential sensor is preferably substantially equal to a mechanical resonance frequency of the movable shutter. Thereby an electric power consumption for obtaining a given amplitude can be significantly reduced.

In the potential sensor, the movable shutter is preferably so constituted as to be controlled by a magnetic field generation means which generates a magnetic field substantially perpendicularly to a movable direction of the movable shutter and a current application means which supplies the movable shutter with a current substantially perpendicularly to the movable direction of the movable shutter and to a direction of the magnetic field, thereby assuming the first state and the second state. The magnetic field generation means is preferably a permanent magnet or an electromagnetic coil. Such configuration, in which the movable shutter itself comprises a part of an actuator, does not require preparation of a separate actuator unit and can therefore be realized compactly. Also in case plural movable shutters are provided, each movable shutter can be operated individually, thereby reducing the mass of a movable part and increasing the operating speed to elevate the sensitivity of the sensor. Also the driver can be realized with a lower cost as a high voltage is not required in driving.

The potential sensor preferably comprises two or more movable shutters and at least two current application means which supplies the movable shutters with currents substantially perpendicularly to the moving directions of the movable shutter, whereby the first state and the second state can be assumed by an interaction of the currents supplied to the movable shutters. Since the movable shutter itself comprises a part of an actuator also in this configuration, a separate actuator unit need not be prepared and a compact configuration can be realized. Also since each movable shutter can be operated individually, it is possible to reduce the mass of a movable part and to increase the operating speed thereby elevating the sensitivity of the sensor. Also the driver can be realized with a lower cost as a high voltage is not required in driving.

According to another aspect of the present invention, there is provided an image forming apparatus comprising the potential sensor and an image forming means which controls an image formation based on an output of the potential sensor. Such configuration allows to provide an image forming apparatus exploiting the features of the potential sensor. The image forming means has, for example, a copying function, a printing function or a facsimile function. Also the image forming means can be realized in a configuration including a photosensitive drum, in which a charged potential of the photosensitive drum is measured by the aforementioned potential sensor provided in an opposed relationship to the photosensitive drum.

According to a further aspect of the present invention, there is provided a potential measuring method comprising: a step of positioning a potential sensor including first and second electrodes and a movable shutter for selectively masking the two electrodes, in which the movable shutter can assume a first state and a second state, the first electrode is exposed wider when the movable shutter assumes the first state than when the movable shutter assumes the second state, and the second electrode is exposed narrower when the movable shutter assumes the first state than when the movable shutter assumes the second state, and a potential-measured object in such a manner that the movable shutter is positioned between the potential sensor and the potential-measured object; and a step of switching the movable shutter between the first state and the second state, and measuring a potential of the potential-measured object based on a change in an electrostatic capacitance generated between the first and second electrodes and the potential-measured object.

According to the present invention, it is rendered possible to increase the area of the detection electrode, in comparison with that in the prior potential sensor utilizing the MEMS technology. It is therefore possible to improve the sensitivity for a same dimension as in the prior technology, or to reduce the dimension for a same sensitivity as in the prior technology. It is also possible to reduce the production cost by increasing a number of sensors per a silicon wafer.

BEST MODE FOR CARRYING OUT THE INVENTION

In the following, in order to clarify embodiments of the present invention, specific examples will be explained with reference to accompanying drawings. In the drawings, arrows referred to by numbers having a hundred digit of 8, e.g. 841 in FIG. 4A and 874 in FIG. 7B, mean directions of currents, respectively, and non-relief arrows referred to by numbers having a hundred digit of 9, e.g. 941 in FIG. 4A and 974 in FIG. 7B, mean directions of movements of portions, respectively.

EXAMPLE 1

Figure 1:
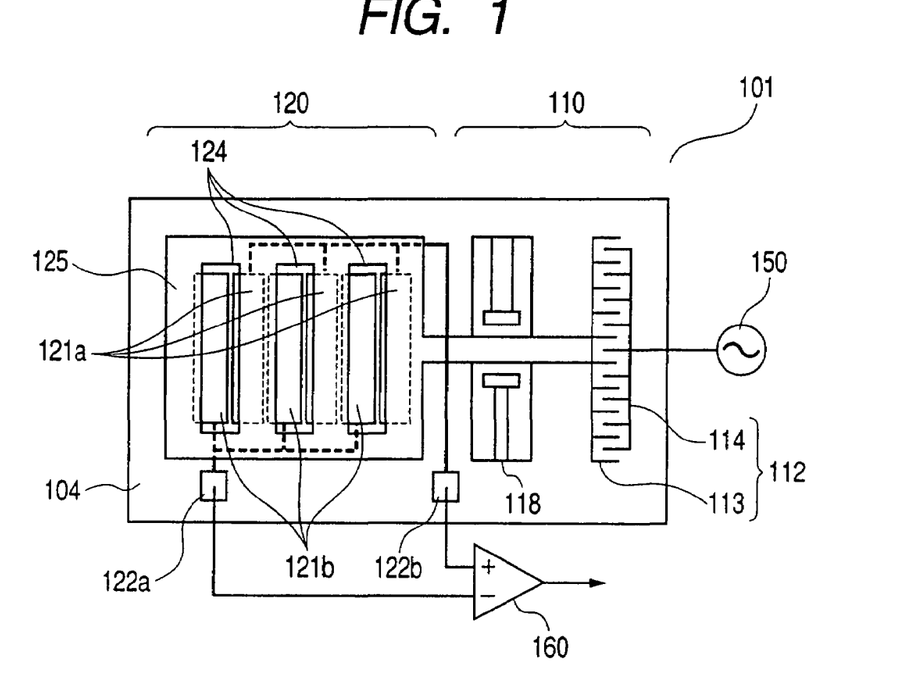
FIG. 1 is a plan view of a potential sensor of an example 1 of the present invention.
Figure 2A:
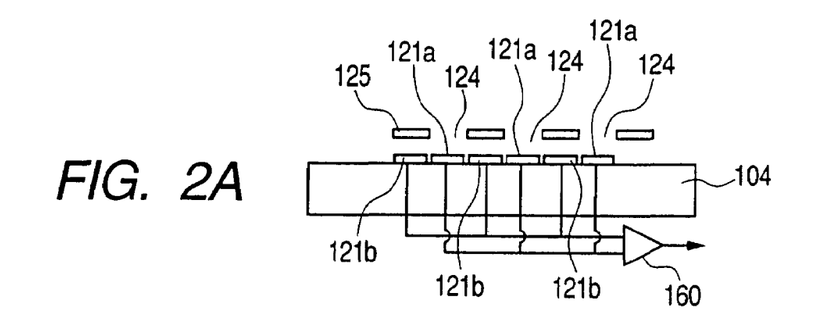
FIGS. 2A and 2B are views showing function of the potential sensor of the example 1.
Figure 2B:
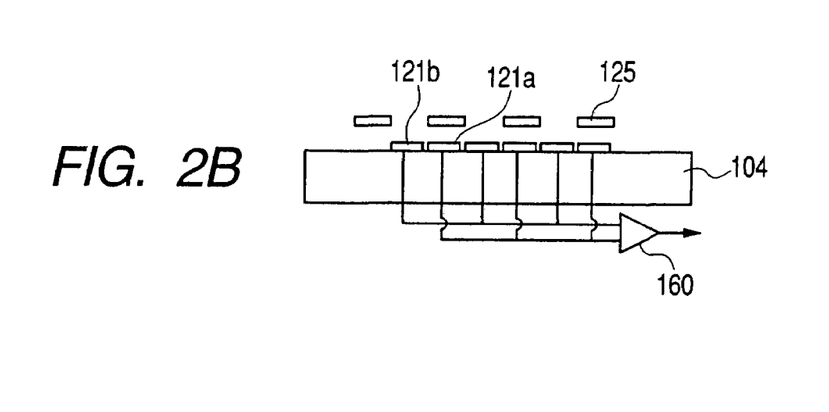

FIG. 1 is a plan view of a potential sensor of Example 1, and FIGS. 2A and 2B are cross-sectional views thereof. A potential sensor 101 is formed by a driver component 110 and a sensor component 120. These are formed by a MEMS technology on a substrate 104.

The driver component 110 is formed by a suspension 118 having a parallel hinge structure, and a comb-shaped electrostatic actuator 112. The comb-shaped electrostatic actuator 112 is a common mechanism for electrostatically driving a micro structure, and is composed of a movable electrode 113 supported by the suspension 118 and a fixed electrode 114 mounted on the substrate 104. The comb-shaped electrostatic actuator 112 is electrically connected to an electrostatic drive signal source 150. The movable electrode 113 is supported by the suspension 118 so as to be movable in a lateral direction in the drawing. The comb-shaped electrodes of the movable electrode 113 and those of the fixed electrode 114 are mutually meshing and an electrostatic attractive force is exerted therebetween when a potential difference is given. This structure is same as in the prior potential sensor explained in the foregoing.

The driver component 110 is connected to the sensor component 120. Detection electrode assemblies 121*a*, 121*b* featuring the present example are fixed to the substrate 104, and each is capable of a capacitative coupling with a surface to be measured. The detection electrode assemblies 121*a*, 121*b* are comprised of sets of mutually distanced individual detection electrodes. The detection electrodes of each set are electrically connected. Also the individual detection electrodes of the detection electrode assemblies 121*a*, 121*b* are arranged with such gaps as not to cause electrical shortcircuiting.

A movable shutter 125 selectively covers the detection electrode assemblies 121*a*, 121*b*. The movable shutter 125 is mechanically connected to the driver component 110, of which a linear displacement induces a corresponding displacement of the movable shutter 125.

The movable shutter 125 is provided with plural apertures 124. When the movable shutter 125 is in a first position (a position moved to the right in FIG. 1), the detection electrode assembly 121*a* is exposed through the apertures 124, while the detection electrode assembly 121*b* is masked (cf. FIG. 2A). Also when the movable shutter 125 is in a second position (a position moved to the left in FIG. 1), the detection electrode assembly 121*a* is masked, while the detection electrode assembly 121*b* is exposed through the apertures 124 (cf. FIG. 2B).

Stated differently, when the movable shutter 125 is in the first position, the detection electrode assembly 121*a* forms a capacitative coupling with an object of which potential is to be measured (hereinafter called "measured object"), and, when the movable shutter 125 is in the second position, the detection electrode assembly 121*b* forms a capacitative coupling with the measured object. Currents generated by the detection electrode assemblies 121*a*, 121*b* are respectively outputted to lead electrodes 122*a*, 122*b* and are subjected to a differential amplification by a differential amplifier 160 to provide a sensor output.

In the aforementioned configuration, it is possible, by selecting the drive frequency of the movable shutter 125 substantially same as a mechanical resonance frequency, to reduce an electric power required for driving thereby alleviating the burden of the driver component 110.

In the present example, as the detection electrode assemblies 121*a*, 121*b* are arranged with small gaps on the substrate 104, an effective area of the detection electrodes can be approximately doubled in comparison with the prior potential sensor utilizing the MEMS technology. It is therefore possible to improve the sensitivity for a same dimension as in the prior technology, or to reduce the dimension for a same sensitivity as in the prior technology. It is also possible to reduce the production cost by increasing a number of sensors per a silicon wafer.

EXAMPLE 2

Figure 3:
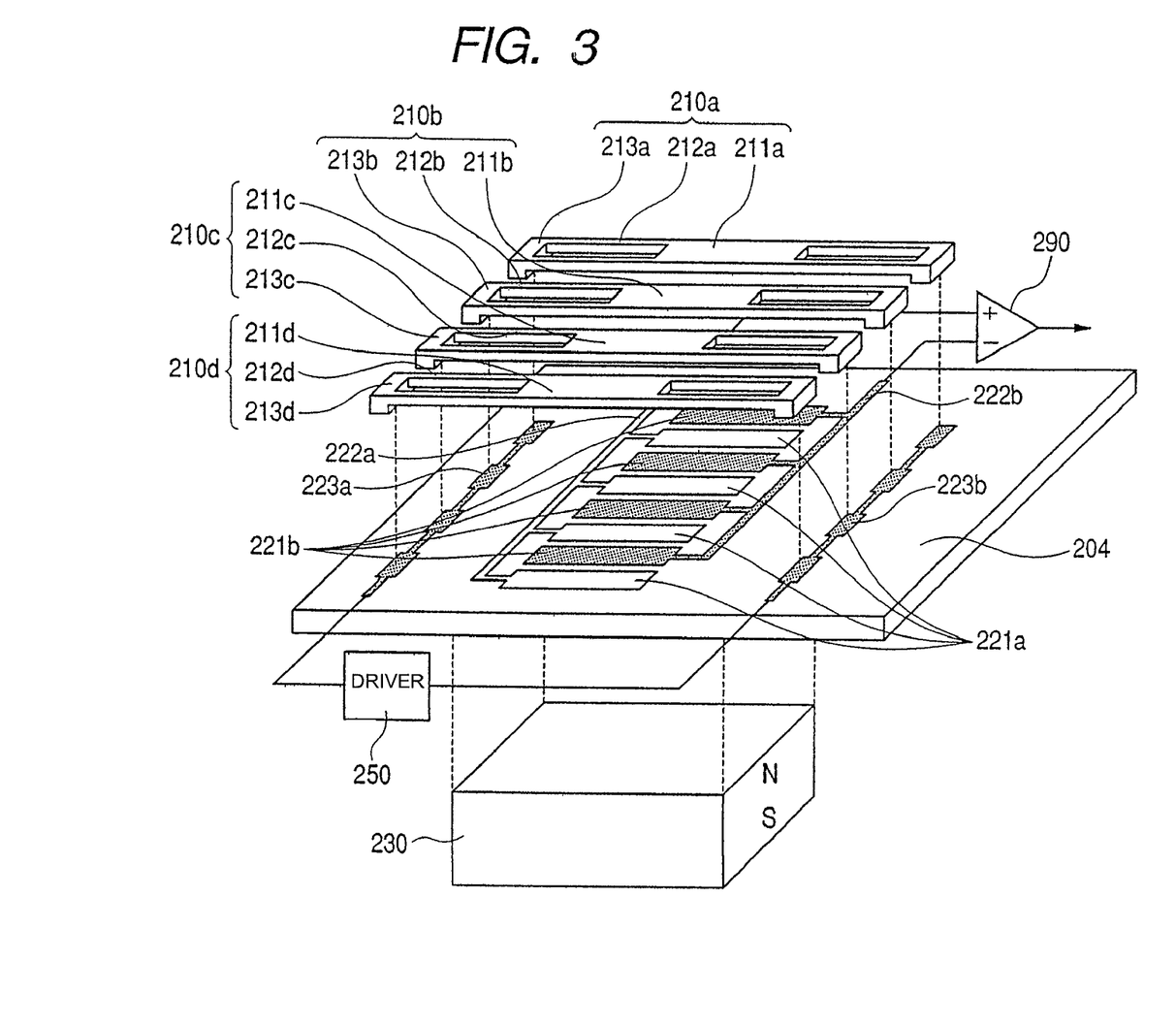
FIG. 3 is an exploded perspective view of a potential sensor of an example 2 of the present invention.

FIG. 3 is an exploded perspective view of a potential sensor of an example 2. On a substrate 204, detection electrode assemblies 221*a*, 221*b*, lead electrodes 222*a*, 222*b* for detection electrodes, and driving lead electrodes 233*a*, 233*b* are formed by patterning. The detection electrode assemblies 221*a*, 221*b* are comprised of sets of mutually distanced individual detection electrodes, and the detection electrodes of each set are electrically connected by the lead electrode 222*a* or 222*b* for the detection electrodes. Also the individual detection electrodes of the detection electrode assemblies 221*a*, 221*b* are arranged with such gaps as not to cause electrical shortcircuiting. Movable shutter units 210*a* to 210*d* are formed by mask members 211*a* to 211*d*, parallel hinge suspensions 212*a* to 212*d* and fixed members 213*a* to 213*d*, which are integrally formed with conductive materials. In the present example, the driving lead electrodes 223*a*, 223*b* are fixedly coupled with the fixed members 213*a* to 213*d*. The mask members 211*a* to 211*d* are supported by the parallel hinge suspensions 212*a* to 212*d* on the detection electrode assemblies 221*a*, 221*b* with a gap thereto. Under the substrate 204, a permanent magnet 230 is positioned to generate a magnetic flux in a direction perpendicular to the substrate 204. The driving lead electrodes 223*a*, 223*b* are electrically connected to a driver 250, while the lead electrodes 222*a*, 222*b* for the detection electrodes are electrically connected with a differential amplifier 290.

Figure 4A:
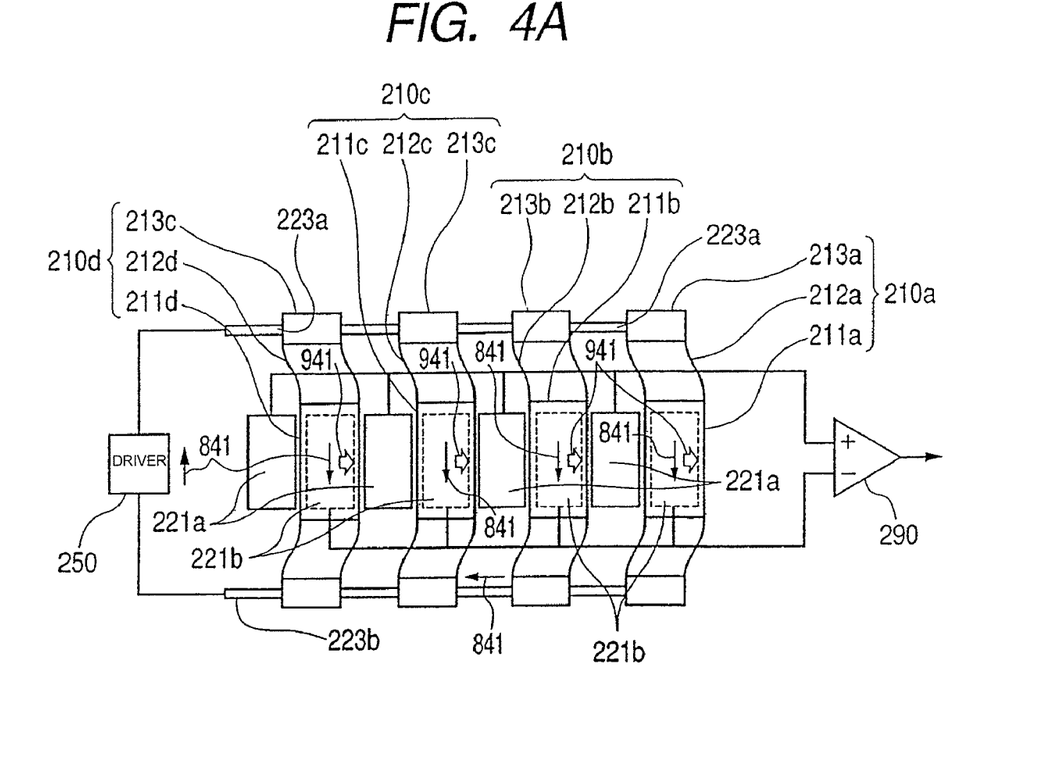
FIGS. 4A and 4B are views showing function of the potential sensor of the example 2.

Now the function of the potential sensor of the above-described configuration will be explained. FIG. 4A is a plan view of the present example. A measured object is positioned in a substantially perpendicular direction opposed to the substrate 204. In such state, when a current 841 is generated from the driver 250 as shown in FIG. 4A and is made to flow from the driving lead electrode 223*a* to 223*b* through the movable shutter units 210*a* to 210*d*, because of the presence of a magnetic field by permanent magnet 230 in a direction from the reverse side of the plane of the drawing to the observe thereof, the parallel hinge suspensions 212*a* to 212*d* are bent and the mask members 211*a* to 211*d* move to the right in the drawing (arrow 941). As a result, the detection electrode assembly 221*a* is exposed to increase an electrostatic capacitance between the detection electrode assembly 221*a* and the measured object, while the detection electrode assembly 221*b* is masked to decrease an electrostatic capacitance between the detection electrode assembly 221*b* and the measured object.

Figure 4B:
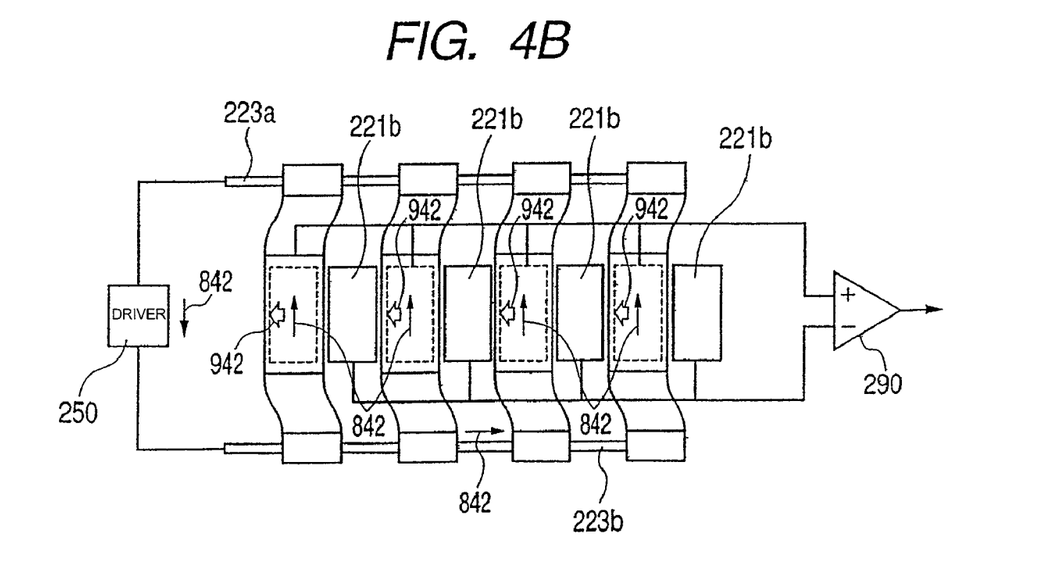

Inversely, when a current 842 is made to flow, as shown in FIG. 4B, in a direction from the driving lead electrode 223*b* to 223*a*, the mask members 211*a* to 211*d* move to the left in the drawing (arrow 942). As a result, the detection electrode assembly 221b is exposed to increase an electrostatic capacitance between the detection electrode assembly 221b and the measured object, while the detection electrode assembly 221a is masked to decrease an electrostatic capacitance between the detection electrode assembly 221a and the measured object.

By repeating the above-described operations, charges of mutually opposite phases are induced in the detection electrode assemblies 221a, 221b and are subjected to a differential amplification by the differential amplifier 290, whereby the potential of the measured object can be measured.

It is possible, by selecting the drive frequency of the movable shutter units 210a to 210d substantially equal to a mechanical resonance frequency, to reduce an electric power required for driving.

Also in the present example, it is possible to increase the area of the detection electrodes. It is therefore possible to improve the sensitivity for a same dimension as in the prior technology, or to reduce the dimension for a same sensitivity as in the prior technology. It is also possible to reduce the production cost by increasing a number of sensors per a silicon wafer.

Also the present example, since the movable shutter itself comprises a part of an actuator, does not require preparation of a separate actuator unit and can therefore be realized compactly. It is therefore possible to improve the sensitivity for a same dimension as in the prior technology, or to reduce the dimension for a same sensitivity as in the prior technology. It is naturally possible also to reduce the production cost by increasing a number of sensors per a silicon wafer.

Also since each movable shutter moves individually, it is possible to reduce the mass of the movable part and to increase the operation speed, thereby improving the sensitivity. Also, in comparison with Example 1, a high voltage is not required for driving, so that the driver can be realized with a lower cost.

EXAMPLE 3

Figure 5:
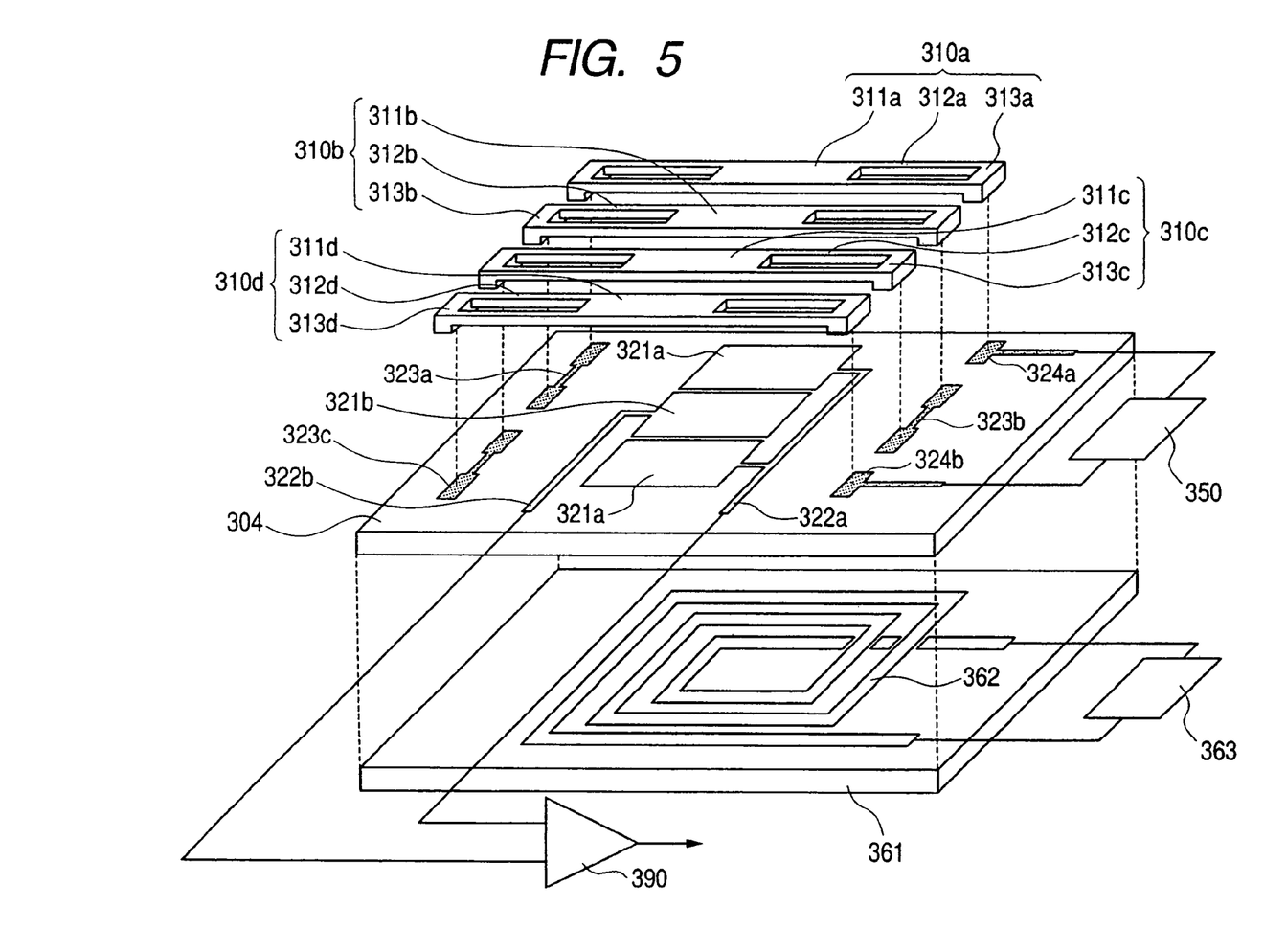
FIG. 5 is an exploded perspective view of a potential sensor of an example 3 of the present invention.

FIG. 5 is an exploded perspective view of a potential sensor of an example 3. On a substrate 204, detection electrode assemblies 321a, 321b, lead electrodes 322a, 322b for detection electrodes, connecting electrodes 323a to 323c, and driving lead electrodes 324a, 324b are formed by patterning. The detection electrode assemblies 321a, 321b are comprised of sets of mutually distanced individual detection electrodes, and the detection electrodes of each set are electrically connected by the lead electrode 322a or 322b for the detection electrodes. Also the individual detection electrodes of the detection electrode assemblies 321a, 321b are arranged with such gaps as not to cause electrical shortcircuiting. Movable shutter units 310a to 310d are formed by mask members 311a to 311d, parallel, hinge suspensions 312a to 312d and fixed members 313a to 313d, which are integrally formed with conductive materials. The connecting electrodes 323a to 323c and the driving lead electrodes 324a, 324b are fixedly coupled with the fixed members 313a to 313d. The mask members 311a to 311d are supported by the parallel hinge suspensions 312a to 312d on the detection electrode assemblies 321a, 321b with a gap thereto. The movable shutter units 310a to 310d are electrically serially connected through the connecting electrodes 323a to 323c and the driving lead electrodes 324a, 324b.

Under the substrate 304, a coil substrate 361 is provided. A flat coil 362 is formed by patterning on the coil substrate 361, and a coil driver 363 supplies the flat coil 362 with a current to generate a magnetic flux in a direction perpendicular to the substrate 304. The driving lead electrodes 324a, 324b are electrically connected to a driver 350, while the lead electrodes 322a, 322b for the detection electrodes are electrically connected with a differential amplifier 390.

Figure 6A:
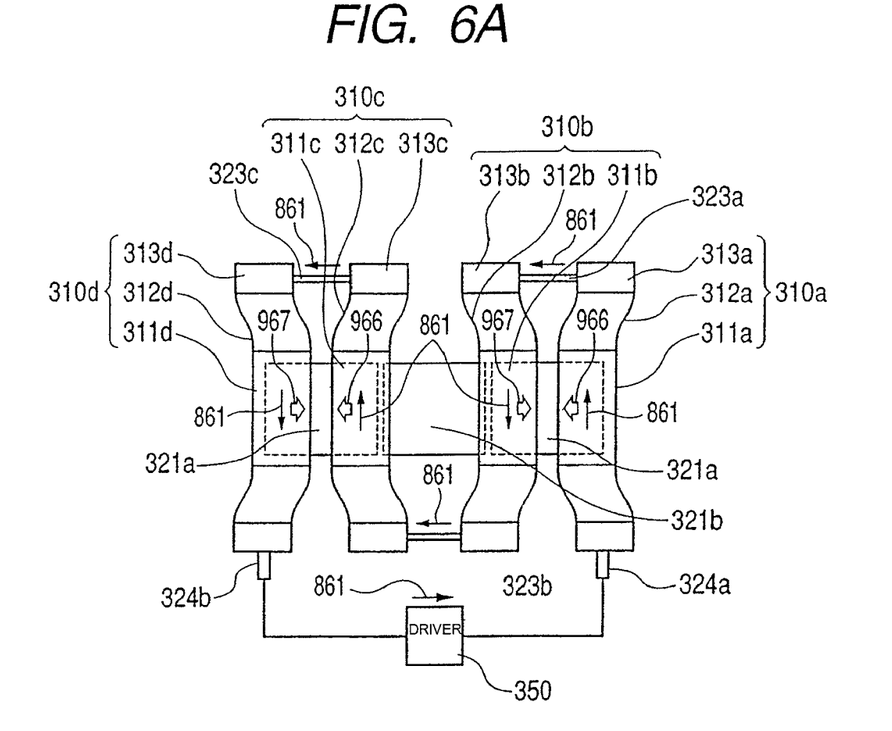
FIGS. 6A and 6B are views showing function of the potential sensor of the example 3.

Now the function of the potential sensor of the present example will be explained. FIG. 6A is a plan view of the present example. A measured object is positioned in a substantially perpendicular direction to the substrate 304. When a current 861 is generated from the driver 350 as shown in FIG. 6A and is made to flow from the driving lead electrode 324a to 324b, because of the presence of a magnetic field in a vertically upward direction with respect to the plane of the drawing, the mask members 311a and 311c move to the left in the drawing (arrow 966), while the mask members 311b and 311d move to the right in the drawing (arrow 967). As a result, the detection electrode assembly 321b is exposed to increase an electrostatic capacitance between the detection electrode assembly 321b and the measured object, while the detection electrode assembly 321a is masked to decrease an electrostatic capacitance between the detection electrode assembly 321a and the measured object.

Figure 6B:
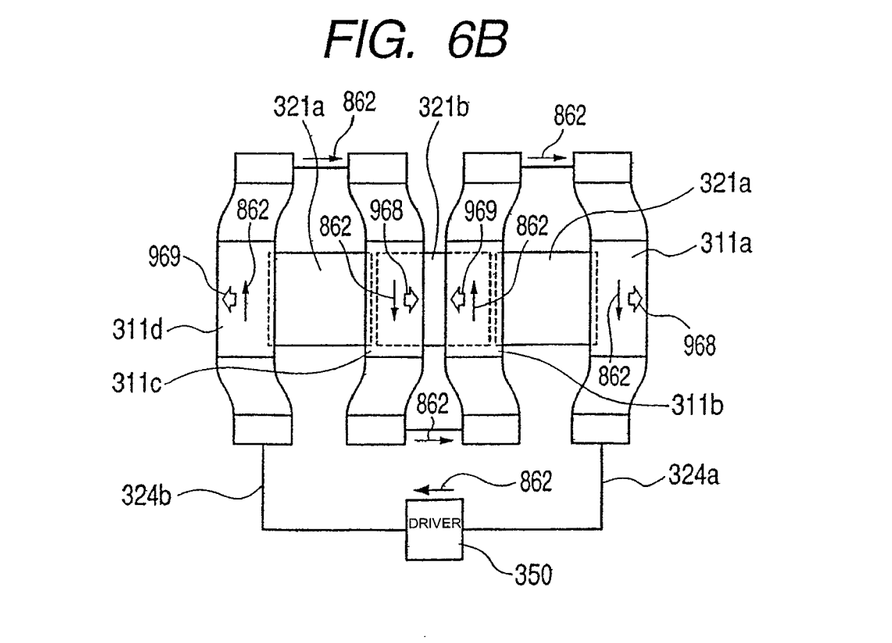

Inversely, when a current 862 is made to flow, as shown in FIG. 6B, in a direction from the driving lead electrode 324b to 324a, the mask members 311a and 311c move to the right in the drawing (arrow 968), while the masks members 311b and 311d move to the left in the drawing (arrow 969). As a result, the detection electrode assembly 321a is exposed to increase an electrostatic capacitance between the detection electrode assembly 321a and the measured object, while the detection electrode assembly 321b is masked to decrease an electrostatic capacitance between the detection electrode assembly 321b and the measured object.

By repeating the above-described operations, charges of mutually opposite phases are induced in the detection electrode assemblies 321a, 321b and are subjected to a differential amplification, whereby the potential of the measured object can be measured.

It is possible, by selecting the drive frequency of the movable shutter units 310a to 310d substantially equal to a mechanical resonance frequency, to reduce an electric power required for driving.

The present example can also provide effects similar to those of Example 2. Also the entire structure can be made thin by dispensing with the permanent magnet.

EXAMPLE 4

Figure 7A:
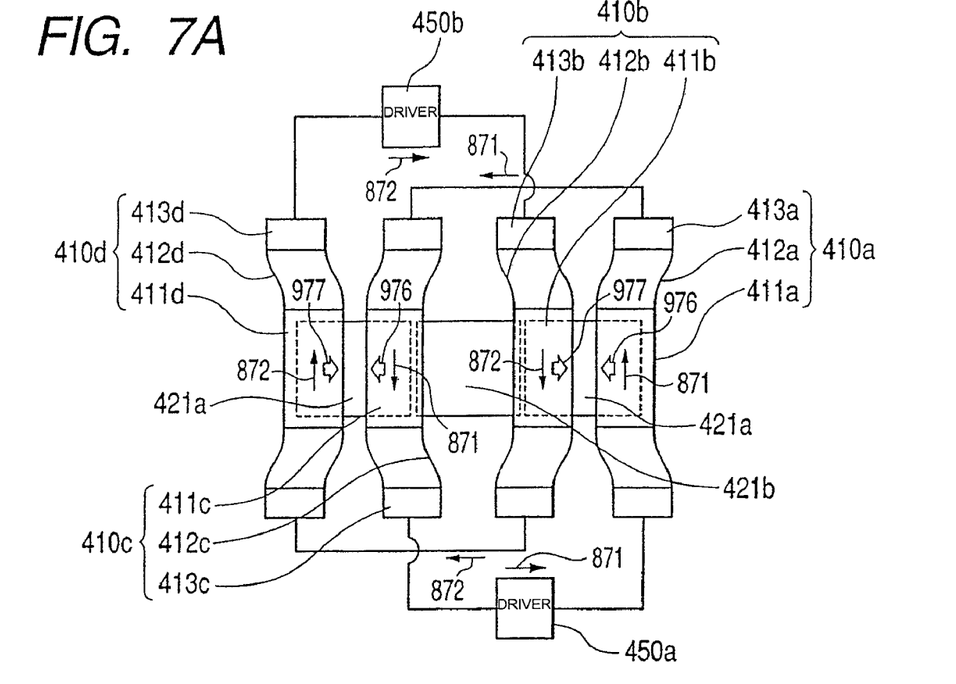
FIGS. 7A and 7B are views showing function of the potential sensor of an example 4.
Figure 7B:
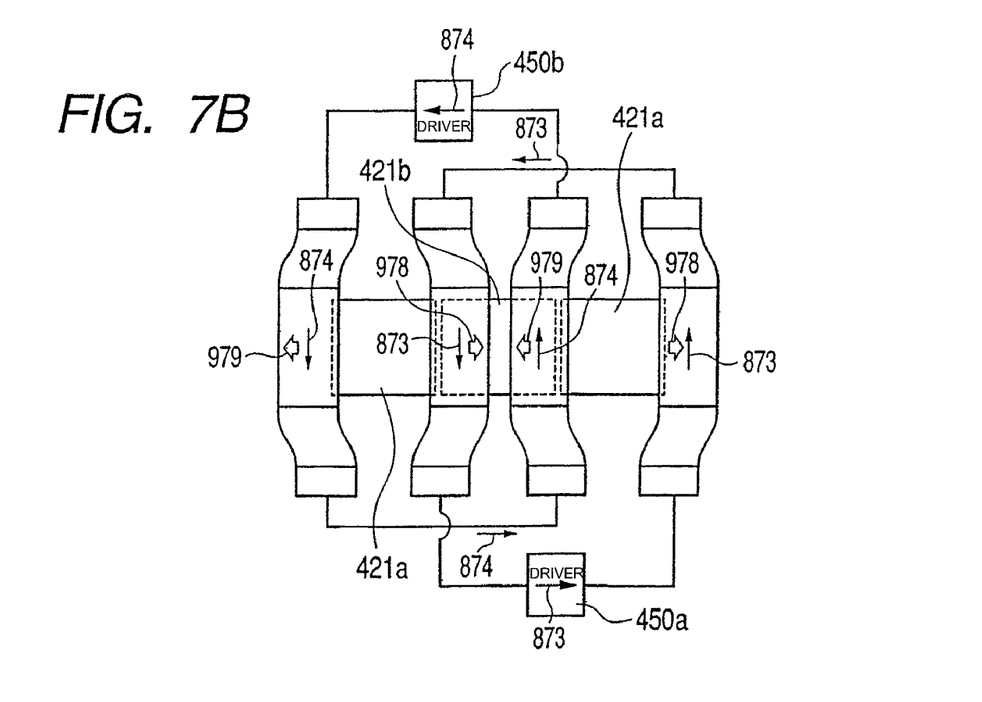

FIGS. 7A and 7B illustrate an example 4. Detection electrode assemblies 421a, 421b and movable shutter units 410a to 410d are structured similarly as in Example 3.

As shown in FIGS. 7A and 7B, the movable shutter units 410a and 410c are electrically serially connected to a driver 450a, while the movable shutter units 410b and 410d are electrically serially connected to a driver 450b.

When the drivers 450a, 450b generate currents 871 and 872 in a direction shown in FIG. 7A, a current in an upward direction in the drawing flows in the movable shutter units 410a and 410d while a current in a downward direction in the drawing flows in the movable shutter units 410b and 410c. Since currents flowing in a same direction cause a mutual repulsion while currents flowing in opposite directions cause a mutual attraction, the mask members 411a and 411c move to the left in the drawing while the mask members 411b and 411d move to the right in the drawing (arrows 976 and 977). As a result, the detection electrode assembly 421a is masked while the detection electrode assembly 421b is exposed.

Also when the direction of the current generated by the driver 450*b* is inverted as shown in FIG. 7B, a current in an upward direction in the drawing flows in the movable shutter units 410*a* and 410*b* while a current in a downward direction in the drawing flows in the movable shutter units 410*c* and 410*d* (arrows 873 and 874). Since currents flowing in a same direction cause a mutual repulsion while currents flowing in opposite directions cause a mutual attraction, the mask members 411*a* and 411*c* move to the right in the drawing while the mask members 411*b* and 411*d* move to the right in the drawing (arrows 978 and 979). As a result, the detection electrode assembly 421*a* is exposed while the detection electrode assembly 421*b* is masked. The potential of the measured object can be measured by measuring the currents flowing in the detection electrode assemblies 421*a*, 421*b* as in Example 3.

Also in this case, it is possible, by selecting the drive frequency of the movable shutter units 410*a* to 410*d* substantially equal to a mechanical resonance frequency, to reduce an electric power required for driving.

The present example can also provide effects similar to those of Examples 2 and 3. Also by employing two or more current generating means, it is rendered possible to dispense with the separate magnetic field generating means and to achieve a further compact structure and a lower cost in comparison with Examples 2 and 3.

In Examples 2 to 4, leg portions of fixed member of the movable shutter unit are fixedly connected to the driving lead electrodes or the connecting electrodes, but it is also possible to form a groove portion or the like comprising a guide portion or a slide end defining portion in such electrode and to slidably fit the leg portion of the fixed member therein, whereby the movable shutter unit is rendered slidable between a masking position and an exposing position for the detection electrode. In such case the parallel hinge suspension can be dispensed with in the movable shutter unit. Such configuration can also provide similar effects.

EXAMPLE 5

Figure 8:
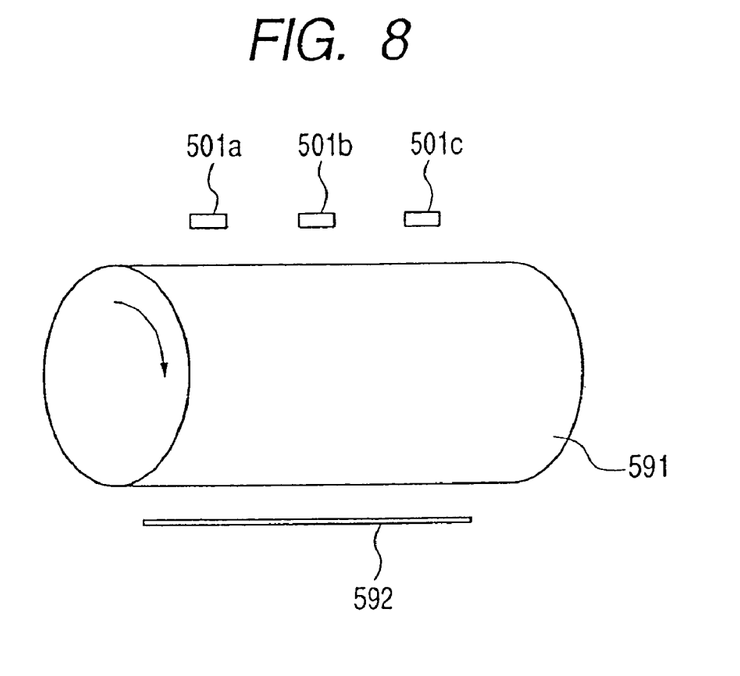
FIG. 8 is a schematic view of an image forming apparatus of an example 5 of the present invention.

FIG. 8 is a view showing a part of an image forming apparatus of an example 5. There are shown potential sensors 501*a* to 501*c* of the invention, a photosensitive drum 591 commonly employed in an electrophotographic process, and a charger 592. A potential distribution on the photosensitive drum 591 can be measured by monitoring outputs of the potential sensors 501*a* to 501*c* in synchronization with the rotation of the photosensitive drum 591. An unevenness in the image can be reduced by controlling an amount of light irradiating the photosensitive drum 591 or controlling the charger 592 according to thus measured potential distribution.

The potential sensor of the present invention, being realizable in a small dimension, can be incorporated in a plurality thereby enabling a high precise control.

The invention claimed is:

1. A potential sensor comprising:
   first and second detection electrodes disposed in a line and adjacent each other on a plane of a substrate opposed to a potential-measured object a potential of which is to be measured; and
   a movable shutter positioned between the detection electrodes and the potential-measured object with gaps thereto, both ends of the movable shutter being supported by a supporting member,
   wherein said movable shutter is configured to assume a first state and a second state, the first detection electrode being entirely exposed and the second detection electrode being entirely masked when the movable shutter assumes the first state, and the first detection electrode being entirely masked and the second detection electrode being entirely exposed when the movable shutter assumes the second state, and
   wherein the movable shutter is comprised of a first shutter vibrating with a first phase and a second shutter vibrating with a second phase, the first and second phase being opposite phases to each other.

2. A potential sensor comprising:
   plural detection electrodes disposed in a line and adjacent each other on a plane of a substrate opposed to a potential-measured object a potential of which is to be measured; and
   plural movable shutters positioned between the detection electrodes and the potential-measure object with gaps thereto, both ends of the movable shutters being supported by a supporting member, each of the plural movable shutters being individually actuated to mask or expose the plural detection electrodes selectively, at least one of the plural movable shutters being activated so as to expose a first detection electrode of the plural detection electrodes and mask a second detection electrode of the plural detection electrodes, which is adjacent to the first detection electrode, at a first state, and so as to expose the second detection electrode and mask the first detection electrode at a second state,
   wherein the movable shutter is comprised of a first shutter vibrating with a first phase and a second shutter vibrating with a second phase, the first and second phase being opposite phases to each other.

3. A potential sensor comprising:
   plural sensor units each of which is comprised of first and second detection electrodes disposed in a line and adjacent each other on a plane of a substrate opposed to a potential-measured object a potential of which is to be measured; and
   a movable shutter positioned between the detection electrodes and the potential-measured object with gaps thereto, both ends of the movable shutter being supported by a supporting member, the movable shutter being selectively positioned in a first state or a second state,
   wherein the movable shutter masks the second detection electrode and exposes the first detection electrode to the potential-measured object in the first state, and masks the first detection electrode and exposes the second detection electrode to the potential-measured object in the second state, and
   wherein the movable shutter is comprised of a first shutter vibrating with a first phase and a second shutter vibrating with a second phase, the first and second phase being opposite phases to each other.

4. A potential sensor comprising:
   a substrate;
   first and second detection electrode assemblies provided in a line and adjacent to each other on a plane of the substrate opposed to a potential-measure object a potential of which is to be measured, at least one of the assemblies being formed in plural parts; and
   a movable shutter provided between the detection electrode assemblies with a gap thereto, both ends of the movable shutter being supported by a supporting member,
   wherein the movable shutter is configured to assume a first state and a second state, the first detection electrode assembly is exposed to a potential-measured object and the second detection electrode assembly is masked when said movable shutter assumes the first state, and the second detection electrode assembly is exposed to the potential-measured object and the first detection electrode assembly is masked when said movable shutter assumes the second state, and wherein the movable shutter is comprised of a first shutter vibrating with a first phase and a second shutter vibrating with a second phase, the first and second phase being opposite phases to each other.

5. A potential sensor comprising:

a plurality of detection electrodes disposed in a line and adjacent each other on a plane opposed to a potential-measured object a potential of which is to be measured; and a plurality of movable shutters positioned between the detection electrodes and the potential-measured object with gaps thereto, both ends of the movable shutters being supported by a supporting member, wherein the plurality of movable shutters comprise first and second movable shutters by which at least one of the detection electrodes is exposed and masked, the first and second movable shutters vibrate with their respective phases opposite to each other;

the second movable shutter masks one part of the detection electrode when the first movable shutter masks the other part of the detection electrode, and the second movable shutter exposes one part of the detection electrode when the first movable shutter exposes the other part of the detection electrode when the first movable shutter exposes the other part of the detection electrode.

* * * * *